United States Patent
Lung (10) Patent No.: US 7,535,756 B2
(45) Date of Patent: May 19, 2009

(54) METHOD TO TIGHTEN SET DISTRIBUTION FOR PCRAM

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 29 days.

(21) Appl. No.: 11/873,344

(22) Filed: Oct. 16, 2007

(65) Prior Publication Data

US 2008/0180990 A1 Jul. 31, 2008

Related U.S. Application Data

(60) Provisional application No. 60/887,543, filed on Jan. 31, 2007.

(51) Int. Cl.
*G11C 11/00* (2006.01)
(52) U.S. Cl. ........................ 365/163; 365/148
(58) Field of Classification Search ............. 365/163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Stephens, Jr. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |

(Continued)

FOREIGN PATENT DOCUMENTS

WO 00/79539 12/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Tan T. Nguyen
(74) *Attorney, Agent, or Firm*—James F. Hann; Haynes Beffel & Wolfeld LLP (57) ABSTRACT

A memory device including a memory cell comprising phase change material is described along with methods for programming the memory device. A method for programming disclosed herein includes applying an increasing first voltage across the memory cell and monitoring current in the memory cell to detect a beginning of a phase transition of the phase change material. Upon detection of the beginning of a phase transition of the phase change material, the method includes applying a second voltage across the memory cell that is a function of the level of the first voltage upon detection of the beginning of a phase transition of the phase change material.

25 Claims, 9 Drawing Sheets

U.S. PATENT DOCUMENTS

| | | | |
|---|---|---|---|
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,077,674 A | 6/2000 | Schleifer et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi et al. | |
| 6,815,704 B1 | 11/2004 | Chen | |
| 6,830,952 B2 | 12/2004 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,903,362 B2 | 6/2005 | Wyeth et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,042,001 B2 | 5/2006 | Kim et al. | |
| 7,054,183 B2 * | 5/2006 | Rinerson et al. | 365/148 |
| 7,067,865 B2 | 6/2006 | Lung et al. | |
| 7,099,180 B1 * | 8/2006 | Dodge et al. | 365/148 |
| 7,132,675 B2 | 11/2006 | Gilton | |
| 7,166,533 B2 | 1/2007 | Happ | |
| 7,214,958 B2 | 5/2007 | Happ | |
| 7,220,983 B2 | 5/2007 | Lung | |
| 2005/0029502 A1 | 2/2005 | Hudgens | |
| 2005/0093022 A1 | 5/2005 | Lung | |
| 2005/0201182 A1 | 9/2005 | Osada et al. | |
| 2005/0212024 A1 | 9/2005 | Happ | |
| 2005/0215009 A1 | 9/2005 | Cho | |
| 2006/0108667 A1 | 5/2006 | Lung | |
| 2006/0110878 A1 | 5/2006 | Lung et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2007/0030721 A1 | 2/2007 | Segal et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |

2007/0176261 A1  8/2007  Lung

FOREIGN PATENT DOCUMENTS

WO          01/45108          6/2001

OTHER PUBLICATIONS

Adler, D. et al., "Threshold Switching in Chalgenid-Glass Thin Films," J. Appl/Phys 51(6), Jun. 1980, pp. 3289-3309.
Ahn, S.J. et al., "A Highly Manufacturable High Density Phase Change Memory og 64 Mb and Beyond," IEEE IEDM 2004, pp. 907-910.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory,"AFIT/GE/ENG/00M-04, Mar. 2000 121 pages.
Chen, et al., "Non-Volatile Resistive Switching for Advanced Memory Applications," IEEE IEDM, Dec. 5-7, 2005, 4 pp.
Cho, S.L. et al., "Highly Scalable On-axis Confined Cell Structure for High Density PRAM beyond 256Mb," 2005 Symposium on VLSI Technology Digest of Technical Papers, pp. 96-97.
Gibson, G.A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y.H. et al., "An Edge Contact Type Cell from Phase Change RAM Featuring Very Low Power Consumtion," 2003 Symposium on VSLI Technology of Technical Papers, pp. 175-176.
Happ, T.D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2007, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-Change RAM Based on 0.24mm-CMOS Technologies," 2003 Symposium on VLSI Technology Digest of Technical Papers, pp. 173-174.
Iwasaki, Hiroko et al, "completely Erasable Phase Change Optical Disk," Jpn. J. Appl. Phys., Feb. 1992, pp. 461-465, vol. 31.
Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
"Magnetic Bit Boost," www.sciencenews.org <http://www.sciencenews.org>, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org <http://www.sciencenews.org>, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999.
Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory <http://klabs.org/richcontent/MAPLDCon99/Papers/P21_Tyson_P.PDF#search='nonvolatile%20high%20density%20high%20performance%20phase%20change%20memory>', 8 pages.
Wolf, Stanley, Excerpt from: Silicon Processing for the VLSI Era-vol. 4, pp. 674-679, 2004.
Wicker, Guy, "A Comprehensive Model of Submicron Chalcogenide Switching Devices," Doctoral Dissertation, Wayne State University, Detroit, MI, 1996.
Wuttig, Matthias, "Towards a Universal Memory?" Nature Materials, Apr. 2005, pp. 265-266, vol. 4.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Ahn, S. J. et al., "Highly Reliable 5nm Contact Cell Technology for 256Mb PRAM," VLSI Technology, Digest of Technical Papers, Jun. 14-16, 2005, pp. 98-99.
Chao, D-S. et al., "Low Programming Current Phase Change Memory Cell with Double gst Thermally Confined Structure," VLSI-TSA 2007, International symposium Apr. 23-25, 2007, 2pp.
"Thermal Conductivity of Crystalline Dielectrics" in CRC Handbook of Chemistry and Physics, Internet Version 2007, (87th edition), David R. Lide, ed. Taylor and Francis, Boca Raton, FL.
Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.
"Optimized Thermal Capacitance in a Phase Change Memory Cell Design," IPCOM000141986D, IP.com Prior Art Database, Oct. 18, 2006, 4 pp.

* cited by examiner

METHOD TO TIGHTEN SET DISTRIBUTION FOR PCRAM

CROSS-REFERENCE TO RELATED APPLICATIONS

This application claims the benefit of U.S. Provisional Application 60/887,543, filed 31 Jan. 2007, entitled Method to Tighten Set Distribution for PCRAM, which is incorporated by reference herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, and to methods for programming such devices.

2. Description of Related Art

Phase change based memory materials have been used in nonvolatile random access memory cells. Phase change materials, such as chalcogenides, can be caused to change between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term amorphous is used to refer to a relatively less ordered structure, more disordered than a single crystal, which has detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material may be switched into either different solid phases or mixtures of the two or more solid phases, providing a gray scale between completely amorphous and completely crystalline states.

The change from the amorphous to the crystalline state, referred to as set or program herein, is generally a lower current operation, requiring a current that is sufficient to raise the phase change material to a level between a phase transition temperature and a melting temperature. The change from crystalline to amorphous, referred to as reset or erase herein, is generally a higher current operation, which includes a short high current density pulse to melt or breakdown the crystalline structure, after which the phase change material cools quickly, quenching the phase change process, allowing at least a portion of the phase change material to stabilize in the amorphous state.

The amount of amorphous phase material in a reset state will vary among memory cells in an array because of variations in materials, manufacturing processes, and the operating environment. These variations result in different programming characteristics including differences in the amount of energy required to program the memory cells.

Thus, applying the same programming pulse to each memory cell in an array will result in a wide distribution of resistance values. Additionally, due to these variations some cells may be set to a resistance outside the resistance range corresponding to the programmed data value, resulting in errors in the stored data of the memory cell.

Thus, there is a need for better ways to program memory cells in memory systems using phase change materials.

BRIEF SUMMARY OF THE INVENTION

A memory device including a memory cell comprising phase change material is described along with methods for programming the memory device.

A method for programming disclosed herein includes applying an increasing first voltage across the memory cell and monitoring current in the memory cell to detect a beginning of a phase transition of the phase change material. Upon detection of the beginning of a phase transition, the method includes applying a second voltage across the memory cell that is a function of the level of the first voltage upon the detection of the beginning of a phase transition of the phase change material. For example, the second voltage can be equal to the level of the first voltage at the time of detection of the beginning of a phase change, and can be applied for a length to time that depends on the data value to be programmed.

A memory device disclosed herein includes a memory cell coupled to a bit line and a word line and including phase change material. The device includes circuitry to selectively couple the bit line to a sensing node, a voltage source coupled to a sensing node, and a sense amplifier including an input coupled to the sensing node. The sense amplifier is adapted to sense a current on the sensing node to detect a beginning of a phase transition of the phase change material and has an output signal indicating the beginning of the phase transition. The device further includes circuitry coupled to the voltage source to control the voltage source to supply an increasing first voltage to the sensing node. The circuitry coupled to the voltage source is responsive to the output signal indicating the beginning of a phase transition of the phase change material to control the voltage source to supply a second voltage to the sensing node that is a function of the level of the first voltage upon the detection of the beginning of a phase transition of the phase change material.

Variations in materials, manufacturing processes, and also the operating environment will result in different programming characteristics including variations in the amount of energy required to program the memory cells. The present invention helps to solve this problem by detecting the beginning of a phase transition and applying a second voltage that is a function of the level of the first voltage upon detection of the beginning of a phase transition of the phase change material. In doing so the resulting resistance values of the memory cells across an array will be tightened.

Other features, aspects and advantages of the present invention can be seen on review of the figures, the detailed description, and the claims which follow.

DETAILED DESCRIPTION OF THE INVENTION

Figure 1:
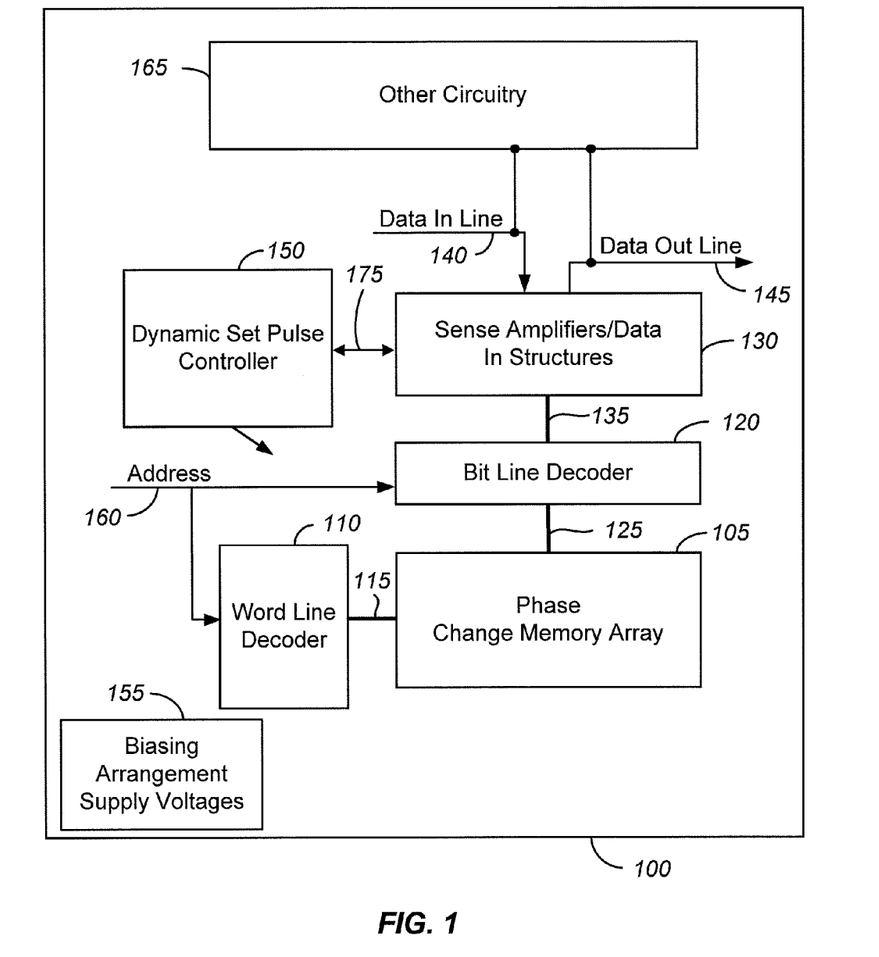
FIG. 1 is a simplified block diagram of an integrated circuit in which the present invention may be implemented.

Referring to FIG. 1, shown is a simplified block diagram of an integrated circuit 100 in which the present invention may be implemented. Circuit 100 includes a memory array 105 implemented using phase change memory cells (not shown), discussed more fully below. A word line decoder 110 is in electrical communication with a plurality of word lines 115. A bit line decoder 120 is in electrical communication with a plurality of bit lines 125 to read data from, and write data to, the phase change memory cells (not shown) in array 105. Addresses are supplied on bus 160 to word line decoder 110 and bit line decoder 120. Sense amplifiers and data-in structures in block 130 are coupled to bit line decoder 120 via data bus 135. Data is supplied via a data-in line 140 from input/output ports on integrated circuit 100, or from other data sources internal or external to integrated circuit 100, to data in structures in block 130. Other circuitry 165 may be included on integrated circuit 100, such as general purpose processor or special purpose application circuitry, or a combination of modules providing system-on-a-chip functionality supported by array 105. Data is supplied via a data-out line 145 from the sense amplifiers in block 130 to input/output ports on integrated circuit 100, or other data destinations internal or external to integrated circuit 100.

A controller 150 implemented in this example using a bias arrangement state machine, controls the application of bias arrangement supply voltages 155, such as read, program, erase, erase verify and program verify voltages. The controller 150 is coupled to the sense amplifiers in block 130 via feedback bus 175, the controller 150 controlling the bias arrangement supply voltages 155 to read, program, and erase memory cells in array 105 in response to output signals of the sense amplifiers. Controller 150 may be implemented using special purpose logic circuitry as known in the art. In alternative embodiments, controller 150 comprises a general-purpose processor, which may be implemented on the same integrated circuit to execute a computer program to control the operations of the device. In yet other embodiments, a combination of special-purpose logic circuitry and a general-purpose processor may be utilized to implementation of controller 150.

Figure 2:
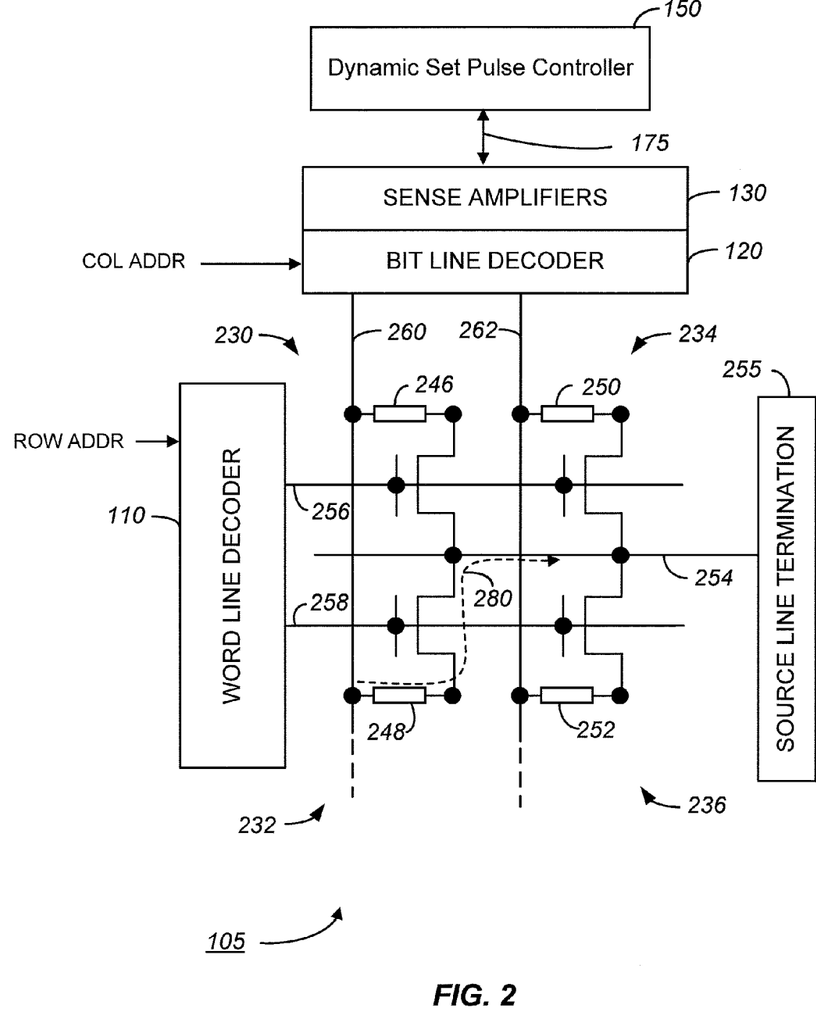
FIG. 2 is a partial schematic diagram of a representative memory array as shown in FIG. 1.

As shown in FIG. 2, each of the memory cells of array 105 includes an access transistor (or other access device such as a diode), four of which are shown as memory cells 230, 232, 234, and 236 having respective phase change memory elements 246, 248, 250, and 252 are illustrated in FIG. 2, representing a small section of an array that can include millions of memory cells.

Sources of each of the access transistors of memory elements 230, 232, 234, and 236 are connected in common to source line 254 that terminates in a source line termination circuit 255, such as a ground terminal. In another embodiment the source lines of the access devices are not electrically connected, but independently controllable. The source line termination circuit 255 may include bias circuits such as voltage sources and current sources, and decoding circuits for applying bias arrangements, other than ground, to the source line 254 in some embodiments.

A plurality of word lines 115 including word lines 256, 258 extends in parallel along a first direction. Word lines 256, 258 are in electrical communication with word line decoder 110. The gates of access transistors of memory cells 230, 234 are connected in common to word line 256, and the gates of access transistors of memory cells 232, 236 are connected in common to word line 258.

A plurality of bit lines 125 including bit lines 260, 262 extend in parallel in a second direction. Memory elements 246, 248 couple the bit line 260 to the respective drains of the access transistors of memory cells 230, 232. Memory elements 250, 252 couple the bit line 262 to the respective drains of the access transistors of memory cells 234, 236.

It will be understood that the memory array 105 is not limited to the array configuration illustrated in FIG. 2, and additional array configurations can also be used. For example, the memory array 105 may also be implemented and using dual word lines and source lines as is described in U.S. application Ser. No. 11/833,143 filed 2 Aug. 2007 entitled "Phase Change Memory with Dual Word Lines and Source Line and Method of Operating the Same", which is incorporated by reference herein.

Embodiments of phase change based memory cells include chalcogenide based materials and other materials, for memory elements. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, N2, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. The post deposition annealing treatment with vacuum or N2 ambient is sometimes needed to improve the crystallized state of chalcogenide material. The annealing temperature typically ranges 100° C. to 400° C. with an anneal time of less than 30 minutes.

Referring again to FIG. 2, in operation each of memory elements 246, 248, 250, 252 have a data state associated therewith. The data state may be determined by comparison of current on a bit line for a selected memory cell to that of a suitable reference current. The reference current can be established so that a predetermined range of currents correspond to a logical "0", and a differing range of currents correspond to a logical "1". In a memory cell having three or more states, the reference current can be established so that differing ranges of bit line currents correspond to each of the three or more states.

Reading or writing to a memory cell of array 105, therefore, is achieved by applying a suitable voltage to one of word lines 258, 256 and coupling one of bit lines 260, 262 to a voltage so that current flows through the selected memory element. For example, a current path 280 through a selected memory cell (in this example memory cell 232 and corresponding memory element 248 are selected) is established by applying voltages to the bit line 260, word line 258, and source line 254 sufficient to turn on the access transistor of memory cell 232 and induce current in path 280 to flow from the bit line 260 to the source line 254, or vice-versa. The level and duration of the voltages applied is dependent upon the operation performed, e.g. a reading operation or a writing operation.

In a reset (or erase) operation of memory cell 232, word line decoder 110 facilitates providing word line 258 with a suitable voltage to turn on the access transistor of the memory cell 232. Bit line decoder 120 facilitates supplying a voltage to bit line 260 of suitable amplitude and duration to induce a current to flow though memory element 248, thereby raising the temperature of at least the active region above the transition temperature of the phase change material of the memory element 248 and also above the melting temperature to place at least the active region in a liquid state. The current is then terminated, for example by terminating the voltage pulse on the bit line 260 and the voltage on the word line 258, resulting in a relatively quick quenching time as the active region rapidly cools to stabilize to an amorphous phase. The reset operation can comprise one or more pulses, for example comprising a pair of pulses.

In a read (or sense) operation of the data state of memory cell 232, word line decoder 110 facilitates providing word line 258 with a suitable voltage to turn on the access transistor of the memory cell 232. Bit line decoder 120 facilitates supplying a voltage to bit line 260 of suitable amplitude and duration to induce current to flow that does not result in the memory element 248 undergoing a change in resistive state. The current on the bit line 260 and through the memory element 248 is dependent upon the resistance of, and therefore the data state associated with, the memory element 248 of the memory cell 232. Thus, the data state of memory cell 232 may be determined by a comparison of the current on bit line 260 to a suitable reference current.

In a set (or program) operation of the data state of memory cell 232, word line decoder 110 facilitates providing word line 258 with a suitable voltage to turn on the access transistor of the memory cell 232. Bit line decoder 120 facilitates supplying a voltage to bit line 260 of suitable amplitude and duration to raise the temperature of a portion of the active region of the phase change material above the transition temperature and cause a transition of a portion of the active region from the amorphous phase into a crystalline phase, this transition lowering the resistance of the memory element 248 and setting the memory cell 232 to the desired date state.

The amount of amorphous phase material in a reset state will vary among memory cells in an array because of variations in materials, manufacturing processes, and the operating environment. These variations result in different programming characteristics including differences in the amount of energy required to program the memory cells. Thus, applying the same programming pulse to each memory cell in an array will result in a wide distribution of resistance values. Additionally, due to these variations some cells may be set to a resistance outside the resistance range corresponding to the programmed data value, resulting in errors in the stored data of the memory cell.

Figure 3:
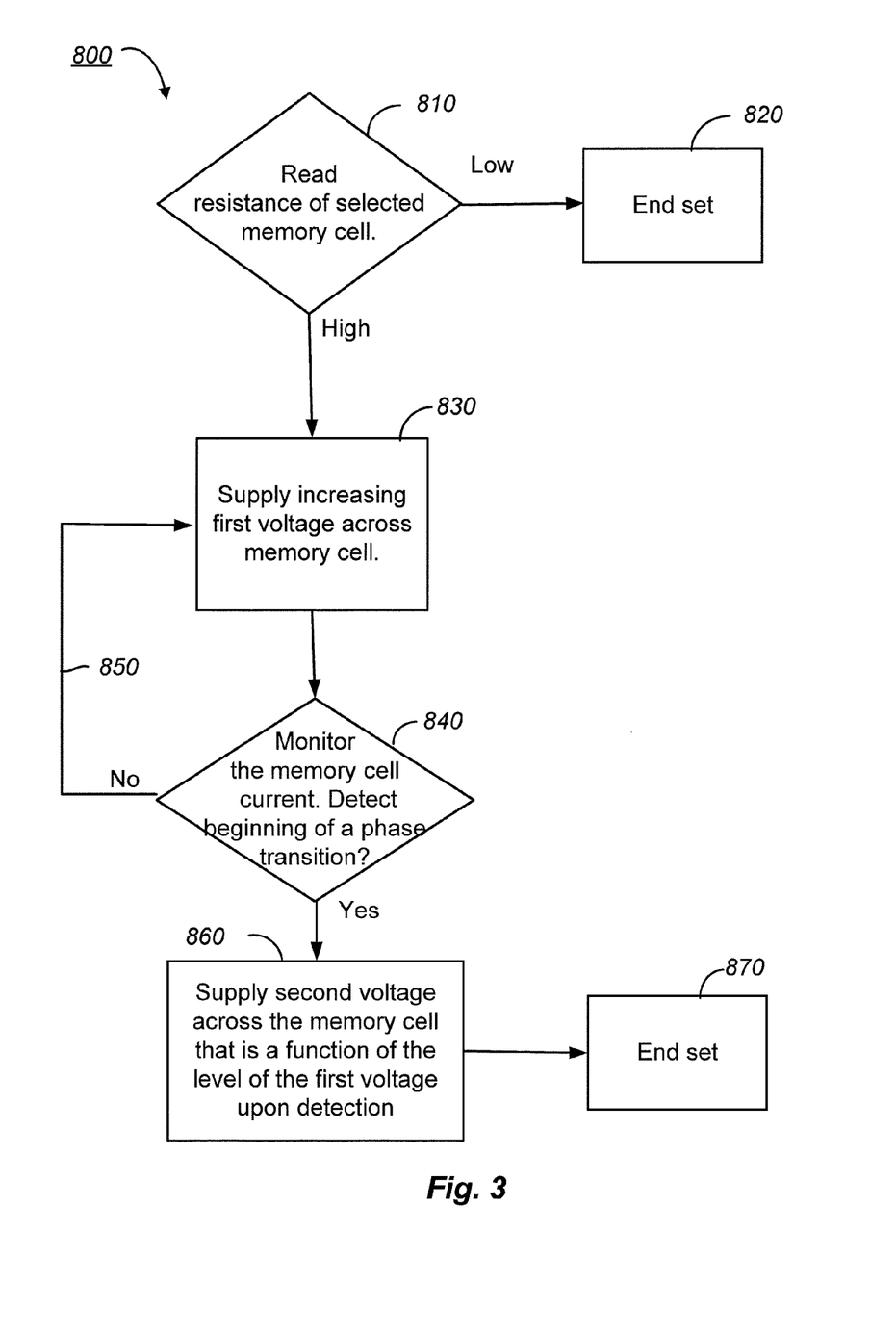
FIG. 3 is a flow diagram of a set operation in accordance with an embodiment for programming a selected memory cell.

FIG. 3 is a flow diagram of a set operation 800 in accordance with an embodiment for programming a selected memory cell in an array of memory cells, the set operation 800 resulting in a tight resistance distribution for memory cells programmed to the same state. In the following explanation, the set operation 800 will be described with reference to memory cell 232 of the array 105 illustrated in FIG. 2.

The set operation 800 begins at step 810 where the resistance of a selected memory cell 232 is read to determine if the selected memory cell 232 needs to be programmed to the desired resistive state. The read operation of step 810 can be accomplished by supplying a voltage to word line 258 sufficient to turn on the access transistor of the selected memory cell 232, and a voltage to bit line 260 sufficient to induce current to flow in path 280 on the bit line 260 and through the memory element 248 to the source line 254 (which is terminated to ground in this example), the voltage insufficient to cause a breakdown of amorphous phase material in the memory element 248. The resistive state (and data state) of memory element 248 may be determined by comparison to a suitable reference current as was described above.

If the selected memory cell 232 is in the low resistance state, the selected memory cell 232 is already programmed and the set operation 800 terminates at step 820.

If the selected memory cell 232 is in the high resistance state, the memory cell 232 has not yet been programmed and the set operation 800 continues to step 830. At step 830 an increasing first voltage is supplied across the memory cell 232. Initially the voltage across the memory cell 232 is insufficient to cause a breakdown of amorphous phase material in the memory element 248. For example, the initial voltage supplied across the memory cell 232 can be the same voltage magnitude that was applied during the read operation of step 810.

In the illustrated embodiment of array 105, increasing the first voltage supplied across the memory cell 232 in step 830 can be accomplished by changing one or more of the voltages supplied to the word line 258, source line 254, and bit line 260 so that the current in the memory cell 232 increases. For example, the source line 254 can be set to ground, a constant voltage can be supplied to word line 258 sufficient to turn on the access transistor of the selected memory cell 232, and an increasing voltage can be supplied to the bit line 260. As another example, the source line 254 can be set to a first voltage, the bit line 260 can be set to a second voltage, and an increasing voltage with time can be supplied to the word line 258. Other examples of voltages supplied to the word line 258, source line 254, and bit line 260 to increase current in the memory cell 232 can also be used and are within the scope of the present invention.

It will be understood that the increasing first voltage supplied across the selected memory cell 232 in step 840 can have any shape. For example, the shape can be stepped or continuous, and may increase in a linear or non-linear fashion or combinations thereof.

At the same time as step 830 is increasing the first voltage across the memory cell 232, at step 840 the current in the memory element 248 is monitored in real time to detect a change in current indicating a breakdown of amorphous phase material in the memory cell 232. In this example this can be accomplished by monitoring the current on bit line 260. Alternatively, the indication of a breakdown of amorphous phase material can be detected by a change in other electrical characteristics of the memory cell 232. It will be understood that a detection of a breakdown of amorphous phase material indicating the beginning of a phase transition may occur some time after the phase transition has begun in some embodiments. So long as the beginning of a phase transition has not been detected, the set operation 800 remains in the feedback path 850 and the voltage supplied across the memory cell continues to increase, thereby increasing the current through the memory cell 232.

Upon detection of the beginning of a phase transition the set operation 800 continues to step 860. In step 860 a second voltage is supplied across the memory cell that is a function of the level of the first voltage upon detection. For example, this can be accomplished by maintaining the bias voltages on the word line 258 and bit line 260 upon detection for a predetermined amount of time.

After step 860 the set operation 800 is terminated at step 870, thereby setting the memory cell 232 to the desired resistive state.

As was described above, applying the same programming pulse to each memory cell in an array will cause a wide distribution of resistance values. The present invention helps to solve this problem by detecting the beginning of a phase transition and applying a second voltage having that is a function of the level of the first voltage upon detection the beginning of a phase transition of the phase change material. In doing so the resulting resistance values of the memory cells across the array will be tightened.

Although a 1-bit per cell set operation (high state or low state resistance) is illustrated in FIG. 3, the scope of the present invention is not limited in this respect. For example, the method illustrated in FIG. 3 can be used to program a memory cell from a first programmed state to a second programmed state.

Programming to three or more states may be accomplished, for example, by determining in step 810 if the selected memory cell is programmed to the desired state. If the memory cell is not programmed to the desired state, continuing to step 830 which may include applying a first pulse or a sequence of pulses to cause a transition of the active region of the phase change material into a "normalizing" phase, for example a generally amorphous phase, which changes the pre-existing state of the selected memory cell into a known condition that is consistent in advance of supplying the increasing voltage across the memory cell. Then in step 860 the second voltage can be selected corresponding to the data value to be programmed.

Figure 4:
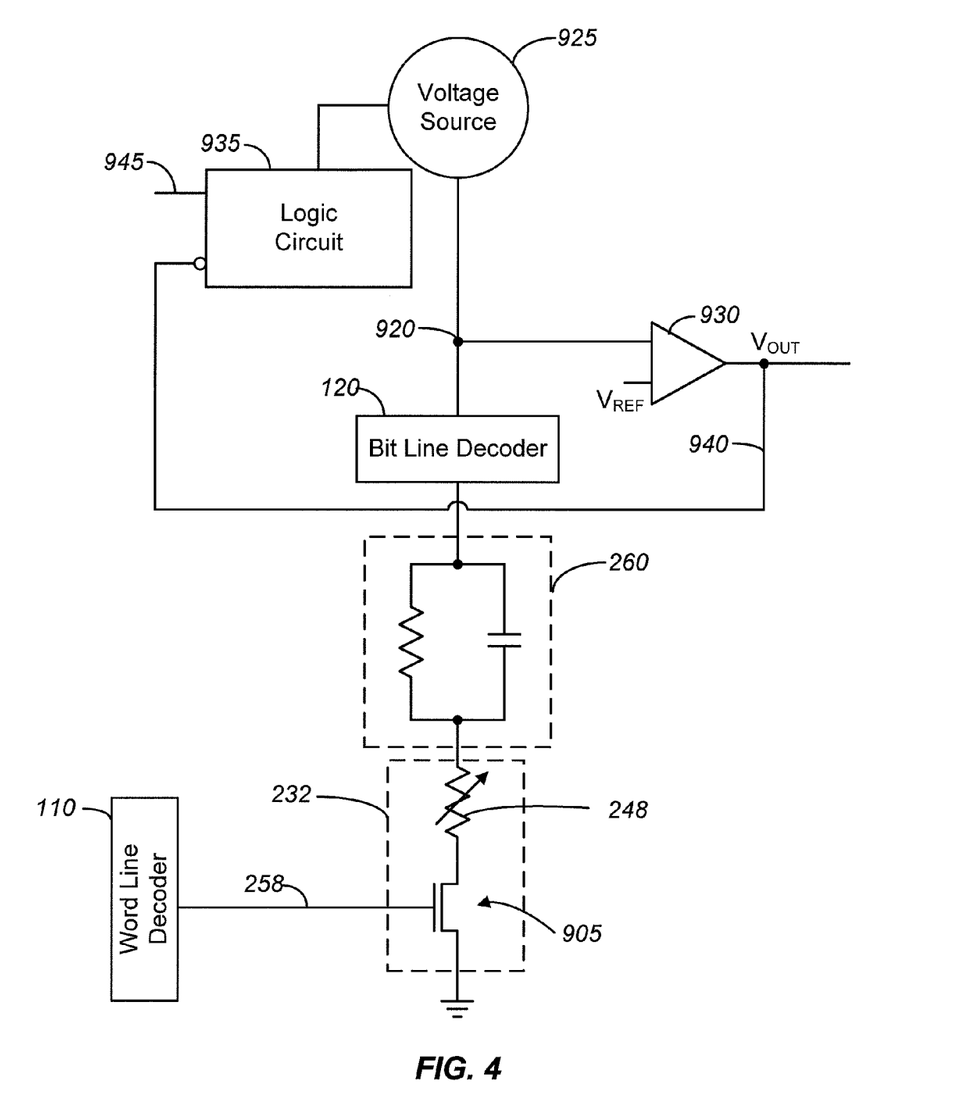
FIG. 4 is a simplified diagram of an architecture for which the set operation of FIG. 3 can be implemented.

FIG. 4 is a simplified diagram of an architecture for which the set operation 800 of FIG. 3 can be implemented.

In the simplified diagram of FIG. 4, memory cell 232 is modeled by access transistor 905 and a variable resistor for phase change element 248. Bit line 260 is modeled by the resistor/capacitor network as shown. A bit line decoder 120 is operable in response to address signals to couple the selected bit line 260 to a sensing node 920. A word line decoder 110 is operable in response to address signals to couple the selected word line 258 to a bias voltage (not shown). A voltage source 925 is controlled by logic circuitry 935, the voltage source 925 applying a voltage to sensing node 920, the voltage supplied from the sensing node 920 coupled through the decoder 120 and bit line 260 to the selected memory cell 232.

The sensing node 920 is also coupled to an input of a sense amplifier 930. The sense amplifier 930 is operable to compare the current on sensing node 920, and thus the current through memory element 248, to a reference voltage $V_{REF}$ applied by reference voltage circuitry not shown. The sense amplifier 930 may alternatively be implemented using a reference current. The sense amplifier 930 generates an output signal $V_{OUT}$ that changes states from a low logic output to a high logic output to indicate the beginning of a phase transition of the phase change material of the memory element 248.

Logic circuitry 935 has a first input 945 coupled to an enable signal, and a second input which is coupled to the output signal $V_{OUT}$ of the sense amplifier 930 via feedback line 940.

Figure 5:
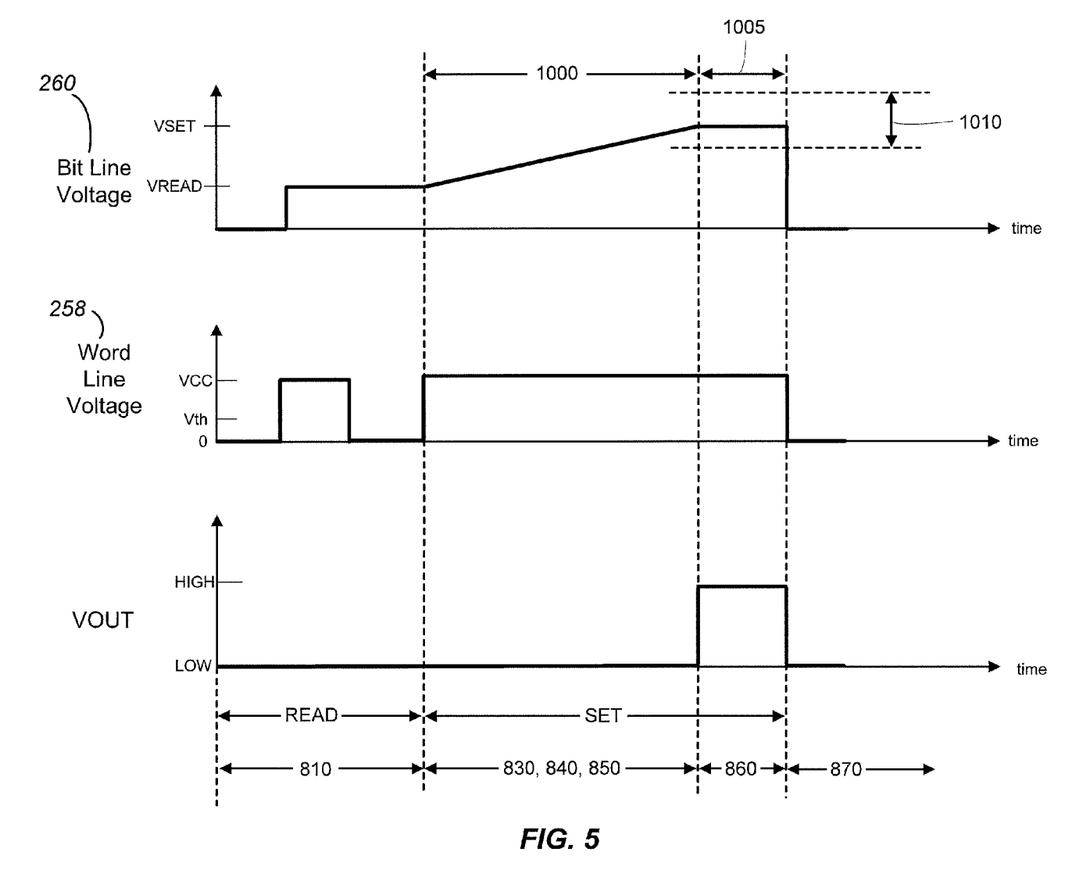
FIG. 5 illustrates a timing diagram for operating the architecture of FIG. 4 in accordance with an embodiment.

A timing diagram in accordance with an embodiment for operating the architecture of FIG. 4 is illustrated in FIG. 5. It will be understood by those skilled in the art that the timing diagram of FIG. 5 is simplified and is not necessarily to scale.

Thus, referring to FIGS. 4 and 5, during a read operation 810 the resistance state of the memory element 248 of the selected memory cell 232 is read. For example, reading the state associated with the phase change element modeled by resistor 248 is achieved by applying a control signal, such as a read enable signal, to an input 945 of logic circuitry 935, as well as applying a word line address signal to word line decoder 110 to drive the selected word line 258 and a bit line address signal to bit line decoder 120 to couple the selected bit line 260 to the sensing node 920. A voltage $V_{CC}$ supplied to the selected word line 258 is above the threshold voltage $V_{th}$ of the access transistor 905.

The control signal applied to input 945 of logic circuit 935 controls the voltage source 925 to supply a voltage pulse with a magnitude $V_{READ}$ to the bit line 260. The voltage pulse with magnitude $V_{READ}$ is sufficient to induce a current to flow on the sensing node 920 and insufficient to change the resistive state of the memory element 248.

The sense amplifier 930 is coupled to sensing node 920 to compare current on the sensing node 920 to a reference $V_{REF}$ and provide a requisite output $V_{OUT}$ corresponding to the data state of the phase change element 940. The sense amplifier 930 may alternatively be implemented using a reference current.

The reference voltage $V_{REF}$ can be established so that a predetermined range of bit line currents correspond to a low resistance (programmed) state, and a differing range of bit line currents correspond to a high resistance state.

During the read operation 810, if the current on the sensing node 920 is within the predetermined range of currents corresponding to the low resistance state the output signal $V_{OUT}$ will be in a high logic state. The high logic state of $V_{OUT}$ results in the set operation 800 being terminated 820 by the logic circuitry 935.

During the read operation 810, if the current on the sensing node 920 is within the predetermined range of bit line currents corresponding to the high resistance state the output signal $V_{OUT}$ will be in a low logic state, and the set operation 800 continues to step 830.

At step 830 the selected word line 258 is supplied a voltage $V_{CC}$ above the threshold voltage $V_{th}$ of the access transistor 905. A control signal, such as a set enable signal, applied to input 945 of logic circuit 935 results in the voltage source 925 set to a voltage such that the voltage supplied to the bit line 260 is linearly increasing and sufficient to induce current to flow on the bit line 260 and through the memory element 248. Initially the voltage on the bit line 260 is insufficient to cause a resistive state change in the memory element 248, and in the illustrated example the initial voltage supplied to the bit line 260 is the same voltage $V_{READ}$ used during the read operation 810.

As can be seen in FIG. 5, for a time 1000 the voltage source 925 increases the voltage supplied to the bit line 260 and the sense amplifier detects the current on the bit line 260 in real time. The voltage supplied to the bit line 260 continues to increase for a time 1000 until the sense amplifier output $V_{OUT}$ changes from a low logic state to a high logic state, indicating the beginning of a phase transition of phase change material of the memory element 248. When the sense amplifier $V_{OUT}$ changes from a low logic state to a high logic state, the bit line voltage has a magnitude $V_{SET}$.

Due to the differences as described above in memory cells in an array, it will be understood that the time 1000 and the amplitude $V_{SET}$ at which a beginning of a phase change is detected may each be different for each memory cell in the array. Generally $V_{SET}$ will be in a range 1010 for memory cells in the array, the magnitude of the range 1010 depending upon the embodiment of the memory element implemented.

Feedback line 940 couples the high logic state of the output $V_{OUT}$ of the sense amplifier 930 to the input of logic circuit 935. The logic circuit 935 then controls the voltage source 925 to maintain the voltage on the bit line 260 at $V_{SET}$ for a predetermined amount of time 1005, the predetermined amount of time 1005 the same for every memory cell programmed to the same state. It will be understood that the present invention is not limited to the embodiment illustrated in FIG. 5, and that the voltage supplied by the voltage source 925 after time 1000 can have any shape that is a function of the voltage $V_{OUT}$ including a sequence of pulses.

After the predetermined amount of time 1005 the current in the bit line 260 is terminated by lowering the bit line voltage and the word line voltage, thereby setting the memory cell 232 to the desired resistive state. In one example the time 1005 is between about 1 ns and about 50 ns.

It will be understood that variations in the shapes as well as the number of pulses in the various steps of FIG. 5 can be used, all of which are within the scope of the present invention.

Figure 6:
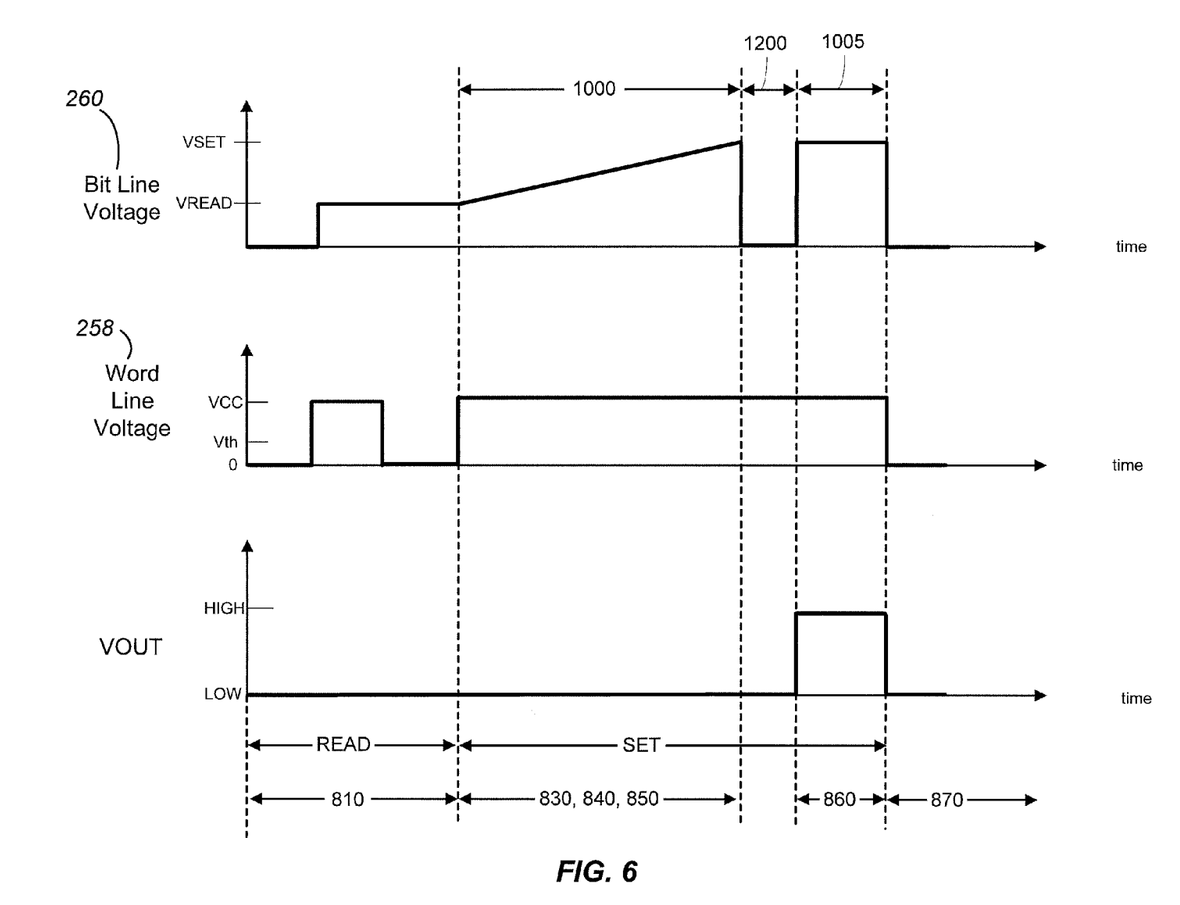
FIG. 6-9 illustrate respective timing diagrams for operating the architecture of FIG. 4 in accordance with alternative embodiments.

For example, as shown in FIG. 6 there may be a predetermined period of time 1200 between the detection of the beginning of phase transition at the end of time 1000 and the beginning of a second voltage at the start of time 1005.

Figure 7:
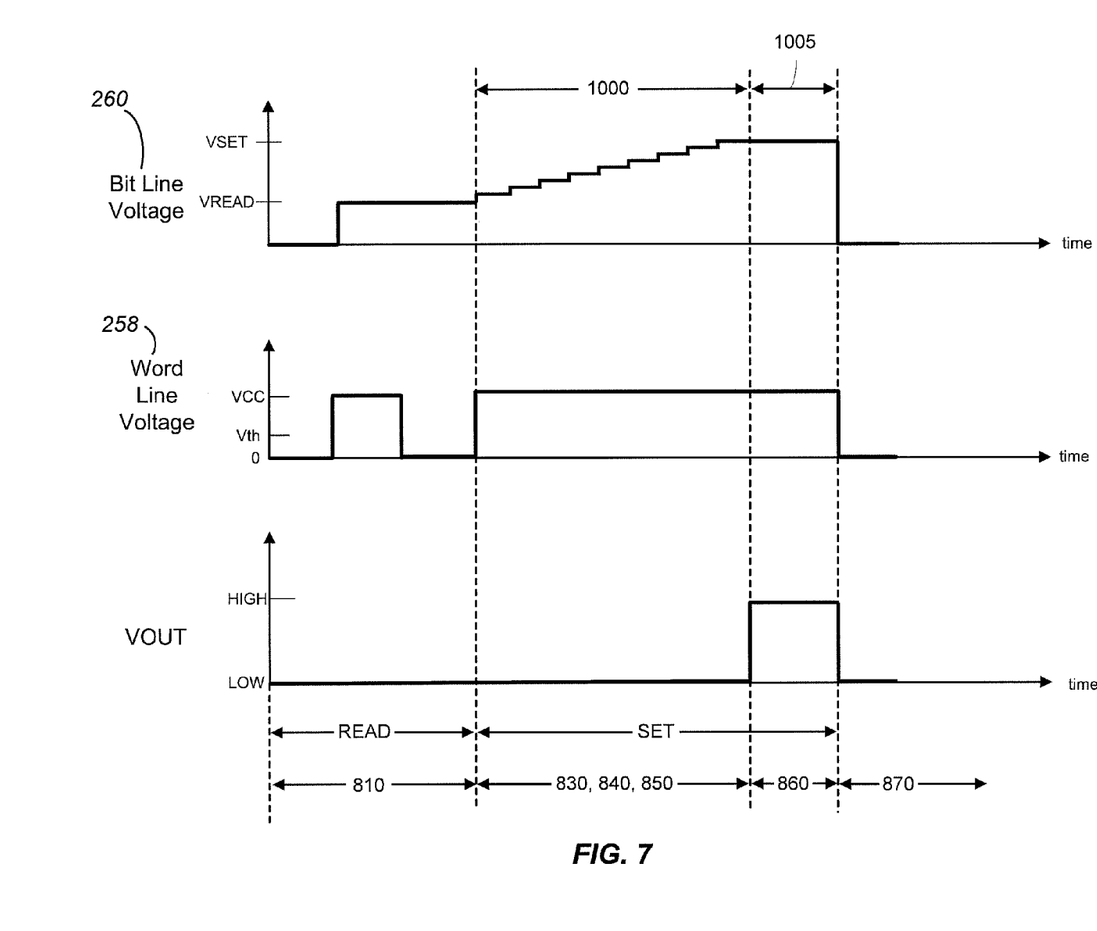

As another example of variations of the timing diagram illustrated in FIG. 5, the voltage on the bit line 260 may increase in a nonlinear fashion or in a combination of linear and nonlinear fashions. In one alternative embodiment, the voltage on the bit line 260 increases during time 1000 in a stepped-ramp fashion as shown in FIG. 7.

In the illustrated embodiment of FIG. 5 the voltage across the memory cell increases by grounding the source line 254, maintaining the voltage on the word line at $V_{CC}$, and increasing voltage on the bit line 260. In one alternative embodiment, the voltage on the bit line 260 is maintained constant while the voltage on the word line 258 increases. Other alternatives for increasing the current, including changing the voltage on the source line 254, can also be used.

Figure 8:
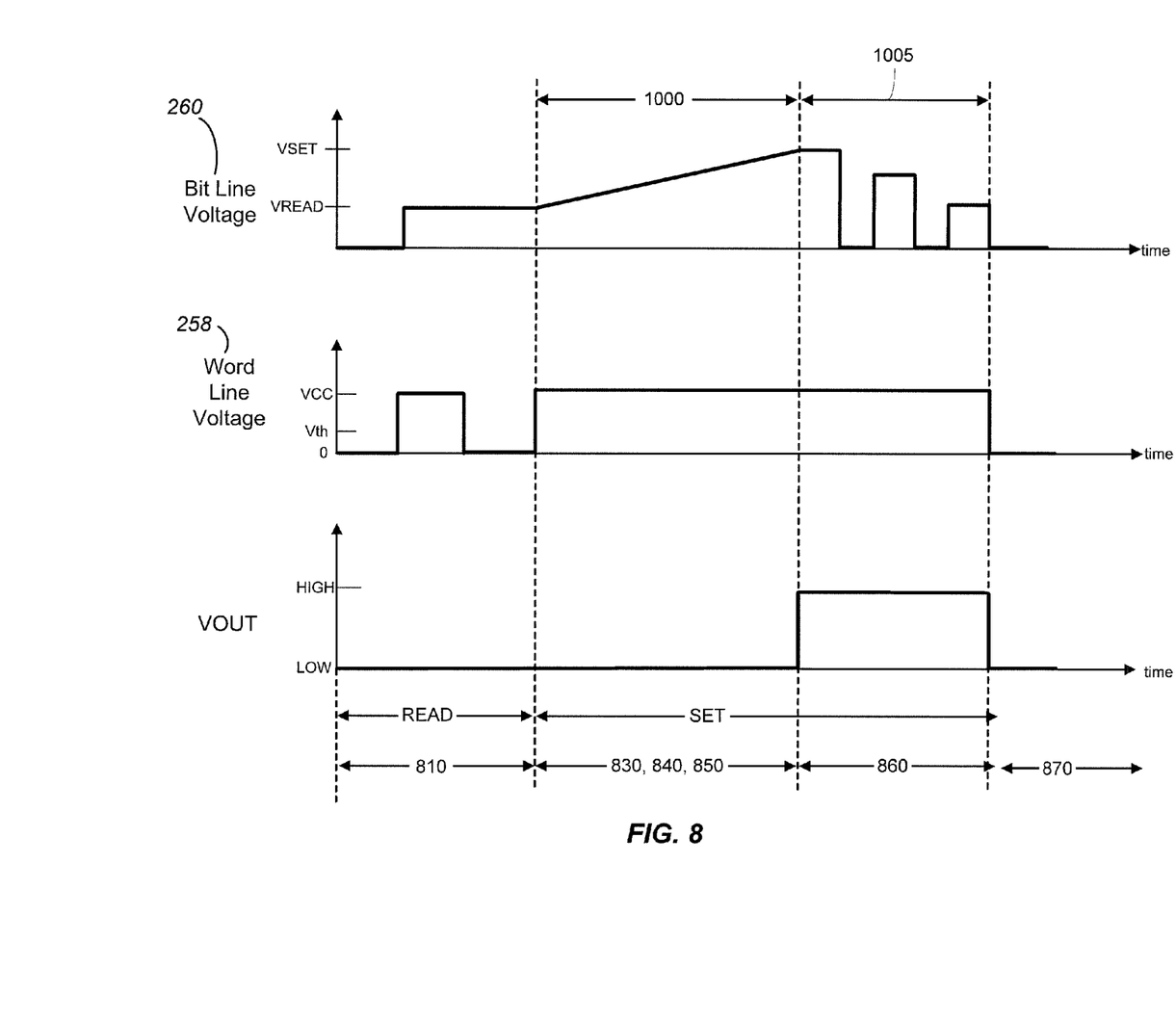

A plurality of pulses may also be supplied at step 860 in FIG. 5, for example a sequence of three pulses applied during time 1005 as illustrated in FIG. 8. At least one of the plurality of pulses applied during time 1005 has a pulse shape that is a function of the voltage of the increasing voltage upon detection after time 1000.

Figure 9:
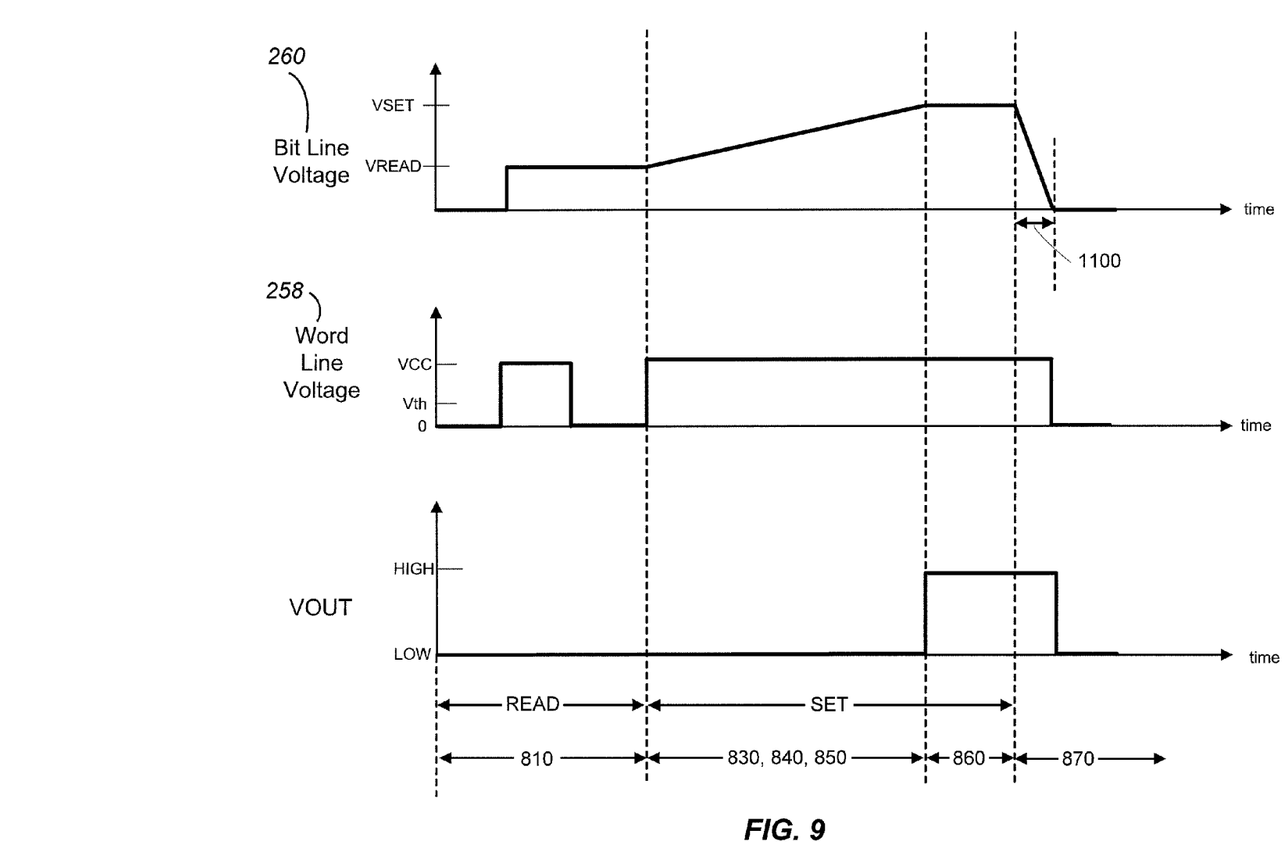

It may be that during the application of $V_{SET}$ for time 1005 portions of the phase change element 248 exhibit localized temperatures that are high enough to cause localized melting of the phase change material. If this occurs, a rapid termination of the current through the memory element 248 may cause some melted regions to stabilize into a generally amorphous, high resistance state due to rapid quenching of the melted regions. FIG. 9, similar to FIG. 5, can help to reduce this problem by less rapidly reducing the bit line voltage during fall time 1100 to less rapidly reduce the current through the memory element 248, possibly allowing the memory element 248 to undergo cooling at a rate such that any localized melted portions transition into the crystalline phase. In one embodiment the time 1100 is greater than or equal to about 1 ns, for example being between about 1 ns and 1000 ns.

In the illustrated embodiment of FIG. 9 the bit line is reduced in a substantially linear fashion over time 1100, although the present invention is not limited in this respect and the bit line voltage may be reduced, for example, using a combination of linear and non-linear fashions. Additionally, a plurality of pulses may be used.

As can be appreciated, alternative embodiments may include one or more of the variations discussed including those with respect to FIGS. 6-9.

It should be noted that although the description herein refers to a single selected memory cell being programmed and read, the concepts are also applicable to programming a number of memory cells simultaneously. For instance, depending upon the array configuration a number of memory cells that are in the same row of the array, and thus coupled to the same the same word line, where each of these cells is coupled to a different bit line, may be programmed or read simultaneously.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A method for programming a memory cell comprising phase change material, the method comprising:
    applying an increasing first voltage across the memory cell and monitoring current in the memory cell to detect a beginning of a phase transition of the phase change material;
    upon detection of the beginning of a phase transition of the phase change material, applying a second voltage across the memory cell that is a function of the level of the first voltage upon the detection of the beginning of a phase transition of the phase change material.

2. The method of claim 1, wherein applying the second voltage includes applying a constant voltage for a predetermined period of time.

3. The method of claim 2, wherein the constant voltage is equal to the level of the first voltage upon detection of the beginning of a phase transition of the phase change material.

4. The method of claim 1, wherein applying the second voltage includes applying a plurality of voltage pulses, at least one of the plurality of voltage pulses having a shape that is a function of the level of the first voltage upon detection of the beginning of a phase transition of the phase change material.

5. The method of claim 1, wherein the second voltage is applied a predetermined period of time after the detection of the beginning of a phase transition of the phase change material.

6. The method of claim 1, wherein the increasing first voltage is a stepped ramp.

7. The method of claim 1, wherein the increasing first voltage is linearly increasing.

8. The method of claim 1, further comprising:
    determining a data value intended to be programmed in the memory cell;
    reading a currently stored data value in the memory cell; and
    applying the increasing first voltage across the memory cell when the currently stored data value is different from the intended data value.

9. The method of claim 8, wherein the reading a currently stored data value in the memory cell comprises applying a read voltage pulse across the memory cell and detecting a current in the memory cell, the current in the memory cell corresponding to the currently stored data value in the memory cell.

10. The method of claim 1, wherein the memory cell is programmable to three or more different data values, and further comprising selecting the second voltage pulse corresponding to the data value to be programmed.

11. The method of claim 1, wherein the memory cell is coupled to a source line and further comprises an access transistor having a gate coupled to a word line, the word line selectively coupling a bit line to the phase change material.

12. The method of claim 11, wherein the applying an increasing first voltage across the memory cell comprises:
    applying a voltage on the word line sufficient to couple the bit line to the phase change material;
    applying a constant voltage on the source line; and
    applying an increasing voltage on the bit line.

13. The method of claim 12, wherein the applying a constant voltage on the source line comprises applying a ground signal on the source line.

14. The method of claim 12, further comprising:
    determining a data value intended to be programmed in the memory cell;
    reading a currently stored data value in the memory cell; and
    applying the increasing first voltage across the memory cell when the currently stored data value is different from the intended data value.

15. The method of claim 14, wherein the reading a currently stored data value in the memory cell comprises:
    applying a voltage on the word line sufficient to couple the bit line to the phase change material;
    applying a voltage on the source line;
    applying a voltage on the bit line sufficient to induce a current to flow in the memory cell; and
    detecting the current in the memory cell, the current in the memory cell corresponding to the currently stored data value in the memory cell.

16. A memory device comprising:
    a memory cell coupled to a bit line and a word line and including phase change material;
    circuitry to selectively couple the bit line to a sensing node;
    a voltage source coupled to the sensing node;
    a sense amplifier including an input coupled to the sensing node, the sense amplifier adapted to sense a current on the sensing node to detect a beginning of a phase transition of the phase change material and having an output signal indicating the beginning of a phase transition; and
    circuitry coupled to the voltage source to control the voltage source to supply an increasing first voltage to the sensing node, and responsive to the output signal indicating the beginning of a phase transition of the phase change material to control the voltage source to supply a second voltage to the sensing node that is a function of the level of the first voltage upon the detection of the beginning of a phase transition of the phase change material.

17. The device of claim 16, wherein the sense amplifier includes a second input coupled to a reference, the sense amplifier adapted to sense a current on the sensing node relative to the reference to detect the beginning of a phase transition of the phase change material.

18. The device of claim 16, wherein the second voltage includes a constant voltage applied for a predetermined period of time.

19. The device of claim 18, wherein the constant voltage is equal to the level of the first voltage upon detection of the beginning of a phase transition of the phase change material.

20. The device of claim 16, wherein the second voltage includes a plurality of voltage pulses, at least one of the plurality of voltage pulses having a shape that is a function of the level of the first voltage upon detection of the beginning of a phase transition of the phase change material.

21. The device of claim 16, wherein the second voltage is applied a predetermined period of time after the detection of the beginning of a phase transition of the phase change material.

22. The device of claim 16, wherein the increasing first voltage level is a stepped ramp.

23. The device of claim 16, wherein the increasing first voltage level is linearly increasing.

24. The device of claim 16, wherein:
the circuitry coupled to the voltage source is responsive to a read enable signal to control the voltage source to supply a read voltage pulse to the sensing node; and
the sense amplifier is adapted to sense a current on the sensing node due to the read voltage pulse to detect a data value in the memory cell, and having an output signal indicating the data value in the memory cell.

25. The method of claim 16, wherein the memory cell further comprises an access transistor having a gate coupled to the word line, and further comprising a source line coupled to the memory cell and coupled to ground.

* * * * *